United States Patent
Lu et al.

(10) Patent No.: US 10,629,590 B2
(45) Date of Patent: Apr. 21, 2020

(54) STACKED RESISTOR-CAPACITOR DELAY CELL

(71) Applicant: QUALCOMM Incorporated, San Diego, CA (US)

(72) Inventors: Ye Lu, San Diego, CA (US); Chao Song, San Diego, CA (US); Haitao Cheng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/115,206

(22) Filed: Aug. 28, 2018

(65) Prior Publication Data
US 2020/0075582 A1   Mar. 5, 2020

(51) Int. Cl.
| | |
|---|---|
| *H01L 27/06* | (2006.01) |
| *H01L 27/02* | (2006.01) |
| *H01L 49/02* | (2006.01) |
| *H01L 23/522* | (2006.01) |
| *H03K 5/00* | (2006.01) |

(52) U.S. Cl.
CPC ...... *H01L 27/0629* (2013.01); *H01L 23/5223* (2013.01); *H01L 27/0207* (2013.01); *H01L 28/60* (2013.01); *H03K 2005/00195* (2013.01)

(58) Field of Classification Search
CPC .......... H01L 27/0629; H01L 23/5223; H01L 27/0207; H01L 29/94
See application file for complete search history.

(56) References Cited

U.S. PATENT DOCUMENTS

| | | | |
|---|---|---|---|
| 8,058,919 B2 | 11/2011 | Takahashi | |
| 9,484,341 B2 | 11/2016 | Kawabata et al. | |
| 9,621,279 B2 | 4/2017 | Okamoto et al. | |
| 9,640,532 B2 | 5/2017 | Gathman et al. | |
| 9,991,171 B1* | 6/2018 | Zhou | H01L 21/8258 |
| 2008/0123448 A1* | 5/2008 | Goetz | G11C 7/12 |
| | | | 365/203 |
| 2015/0236014 A1* | 8/2015 | Gathman | H01L 27/0808 |
| | | | 327/537 |
| 2016/0155737 A1* | 6/2016 | Linewih | H02H 9/04 |
| | | | 361/56 |
| 2017/0179848 A1* | 6/2017 | Shimizu | H01L 27/0629 |
| 2018/0025974 A1 | 1/2018 | Basker et al. | |

* cited by examiner

*Primary Examiner* — Julia Slutsker
(74) *Attorney, Agent, or Firm* — Qualcomm Incorporated/Seyfarth Shaw LLP

(57) ABSTRACT

A resistor-capacitor (RC) delay circuit includes a first capacitor at a first level, a resistor at a second level and a second capacitor at a third level. The second capacitor is electrically connected in parallel with the first capacitor. The second capacitor has a footprint within a footprint of the first capacitor. The resistor is coupled in shunt with the first capacitor and the second capacitor.

20 Claims, 14 Drawing Sheets

By varying finger space (>40nm), MOMCAP can support voltage up to 3.3V

US 10,629,590 B2

STACKED RESISTOR-CAPACITOR DELAY CELL

BACKGROUND

Field

Aspects of the present disclosure relate to semiconductor devices and, more particularly, to delay cells.

Background

Mobile radio frequency (RF) chips (e.g., mobile RF transceivers) have migrated to a deep sub-micron process node due to cost and power consumption considerations. Designing such mobile RF transceivers becomes complex at this deep sub-micron process node. Designing these mobile RF transceivers is further complicated by added circuit functions for supporting communications enhancements, such as fifth generation (5G) communications. Further design challenges for mobile RF transceivers include analog/RF performance considerations, including mismatch, noise, and other performance considerations. Designs of these mobile RF transceivers may include additional passive devices, for example, for biasing and suppressing resonance, and/or for performing filtering, bypassing, and coupling.

Conventional resistor-capacitor (RC) delay cells are implemented using resistors (R) and capacitors (C) and occupy a large area on a chip. This is because a significant number of resistors and capacitors are used in RC delay cells. The increased area of RC delay cells stems from connecting one resistor and one capacitor on a same or different layer to form one RC delay cell. This configuration does not provide enough RC delay for a delay cell and occupies a relatively large footprint. Therefore, it is desirable to have a delay cell with improved RC delay and a reduced footprint.

SUMMARY

A resistor-capacitor (RC) delay circuit includes a first capacitor at a first level, a resistor at a second level and a second capacitor at a third level. The second capacitor is electrically connected in parallel with the first capacitor. The second capacitor has a footprint within a footprint of the first capacitor. The resistor is coupled in shunt with the first capacitor and the second capacitor.

A method of fabricating a resistor-capacitor (RC) delay circuit includes fabricating a first capacitor at a first level. The method also includes fabricating a resistor at a second level. The method further includes fabricating a second capacitor at a third level. The second capacitor is electrically connected in parallel with the first capacitor. The second capacitor has a footprint within a footprint of the first capacitor. The resistor is coupled in shunt with the first capacitor and the second capacitor.

A resistor-capacitor (RC) delay circuit includes a first capacitor at a first level, a resistor at a second level and means for storing electrical charge at a third level. The electrical charge storing means is electrically connected in parallel with the first capacitor. The electrical charge storing means has a footprint within a footprint of the first capacitor. The resistor is coupled in shunt with the first capacitor and the electrical charge storing means.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
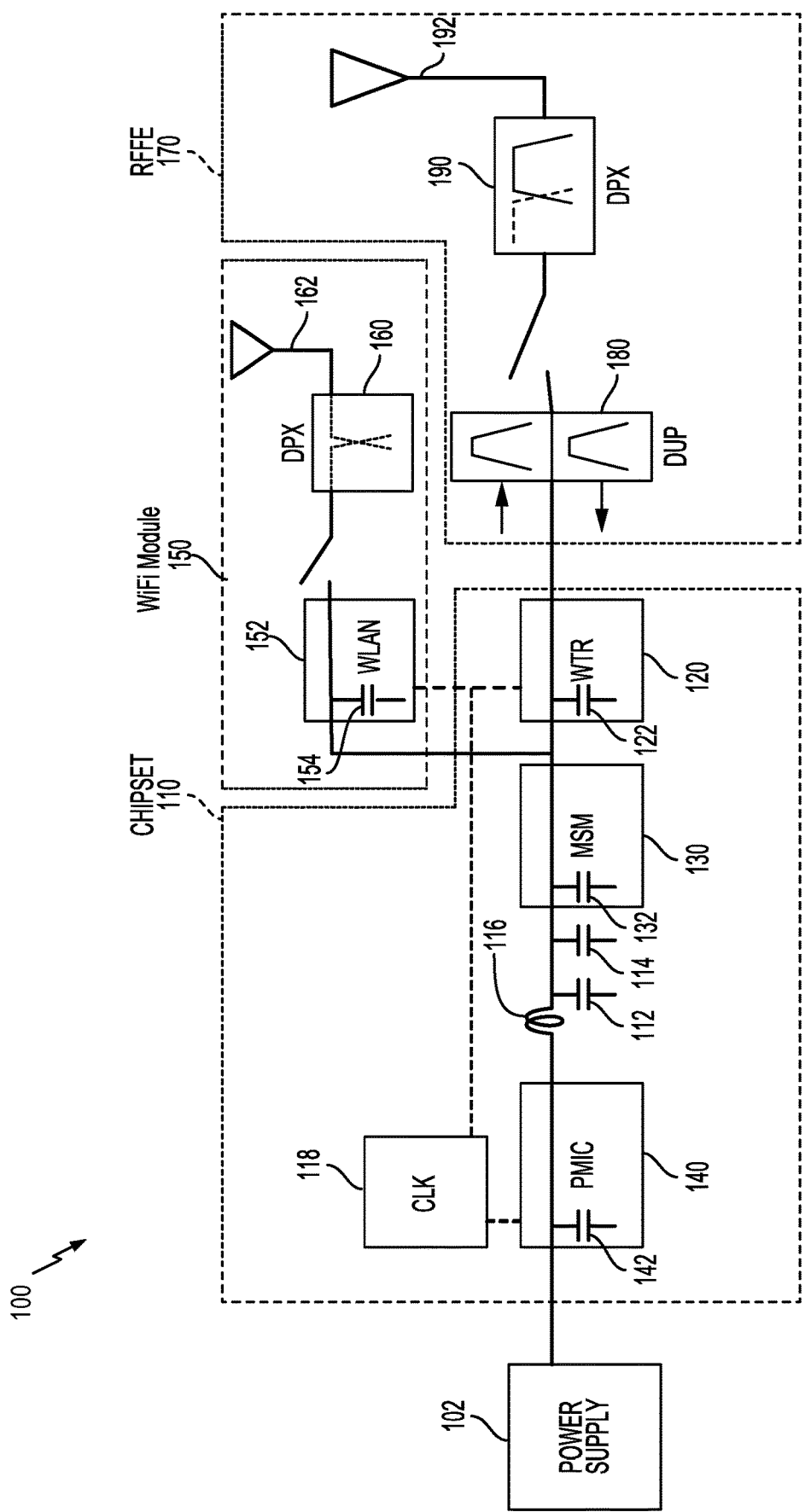
FIG. 1 is a schematic diagram of a radio frequency (RF) front-end module.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR", and the use of the term "or" is intended to represent an "exclusive OR." As described, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communications enhancements, such as fifth generation (5G) wireless communications. In particular, mobile RF chips are a major driving force for advancing miniaturization of electronics. While tremendous improvements are being realized for miniaturizing wireless communications subsystems, such as mobile RF transceivers, RF passive devices have not experienced such improvements.

These mobile RF transceivers may be designed using RF delay cells. For example, mobile RF transceivers in wireless communications systems generally rely on RF (e.g., resistor-capacitor (RC)) delay cells for processing signals carried in the wireless communications system. Many passive devices may be included in these RF delay cells. In practice, each of these passive devices may include many resistors and capacitors.

Resistive strips (e.g., polysilicon) may be implemented in a delay cell to combine the functionality of resistors and capacitors. Conventional RC delay cells are implemented using resistors (R) and capacitors (C) in a one-to-one configuration that occupies a large area on a chip. This is because many resistors and capacitors are used in these RC delay cells. For example, a conventional resistor-capacitor (RC) delay cell connects one resistor and one capacitor on a same or different layer. This RC structure does not provide enough RC delay for purposes of the delay cell and has a relatively large footprint.

Various aspects of the present disclosure provide techniques for fabricating stacked RC delay cells that occupy a reduced chip area. The process flow for fabrication of the RC delay cells may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

Aspects of the present disclosure are directed to stacking metal or poly resistors with multiple capacitors (e.g., two or three capacitors) to form a single RC delay circuit or cell with improved delay. For example, the RC delay circuit may include a first capacitor at a first level, a first resistor at a second level and a second capacitor at a third level. The second capacitor is electrically connected in parallel with the first capacitor. The second capacitor has a footprint within a footprint of the first capacitor. The resistor is coupled in shunt with the first capacitor and the second capacitor. The first capacitor of the RC delay circuit can be a metal-oxide-semiconductor (MOS)/metal-insulator-metal (MIM)/metal-oxide-metal (MOM) capacitor. The resistor can be a poly/metal resistor.

In some aspects of the disclosure, the RC delay circuit includes a third capacitor at a fourth level. The third capacitor is electrically connected in parallel with the first capacitor and the second capacitor. The third capacitor has a footprint within the footprint of the first capacitor. The first capacitor may include a negative capacitance material. Examples of negative capacitance materials include, but are not limited to, lead zirconate titanate (Pb(Zr0.2Ti0.8)O3), hafnium based zinc oxide (Hf0.42Zr0.58O2) and aluminum indium nitride (Al0.83In0.17N). The first capacitor may be a metal-oxide-metal (e.g., a finger MOM) capacitor with via connections (e.g., super via connections).

Advantages of the stacked RC delay cell include increasing the RC delay while providing a large RC structure with a reduced footprint. For example, the combination of the polysilicon or metal resistor with multiple (e.g., two or three kinds of different capacitors) capacitors on a chip at different layers provides a large RC structure with a reduced footprint. While the resistors and capacitors are stacked at different levels the resistors and capacitors do not occupy different footprints, which achieves area savings at no additional cost. Additionally, there is limited or no negative impact to any other part of the circuits.

FIG. 1 is a schematic diagram of a wireless device 100 (e.g., a cellular phone or a smartphone) having a RC delay cell, according to aspects of the present disclosure. The wireless device 100 may include a wireless local area network (WLAN) (e.g., WiFi) module 150 and a RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communications. A mobile RF transceiver may include a transmit section for data transmission and a receive section for data reception. For data transmission, the transmit section may modulate a RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communications signal.

The wireless transceiver 120 may include one or more circuits for amplifying these communications signals. The amplifier circuits (e.g., LNA/PA) may include one or more amplifier stages that may have one or more driver stages and one or more amplifier output stages. Each of the amplifier stages includes one or more transistors configured in various ways to amplify the communications signals. Various options exist for fabricating the transistors that are configured to amplify the communications signals transmitted and received by the wireless transceiver 120.

Figure 2:
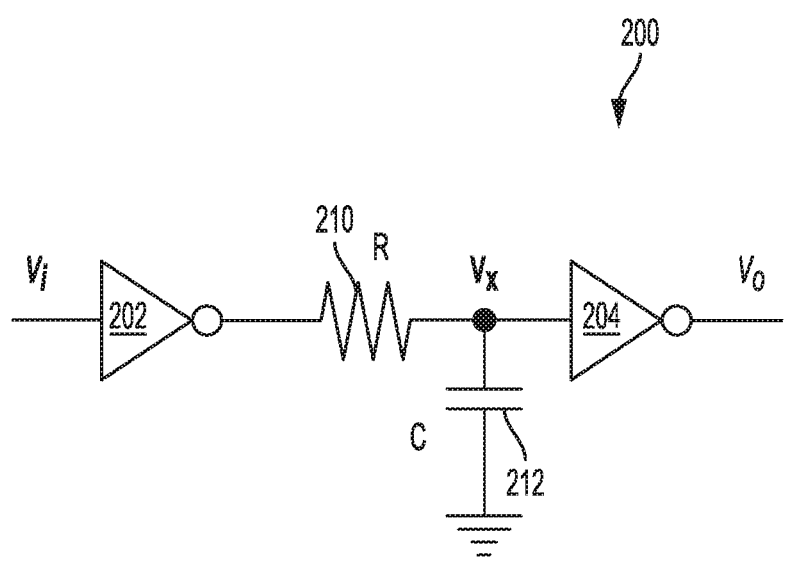
FIG. 2 is a schematic diagram of a conventional delay cell.

FIG. 2 is a schematic diagram of a conventional delay cell 200. The conventional delay cell 200 includes a resistor 210 coupled between a first inverter 202 and a second inverter 204. A capacitor 212 is coupled between the resistor 210 and the second inverter 204. The capacitor 212 is also coupled to ground.

An input voltage (Vi) is received at an input of the first inverter 202. An output voltage (Vo) is present at an output of the second inverter 204. Voltage Vx is a measured voltage at the node between the resistor 210, the capacitor 212, and the second inverter 204. The resistor 210 and the capacitor 212 of the conventional delay cell 200 have a one-to-one relationship.

Figure 3:
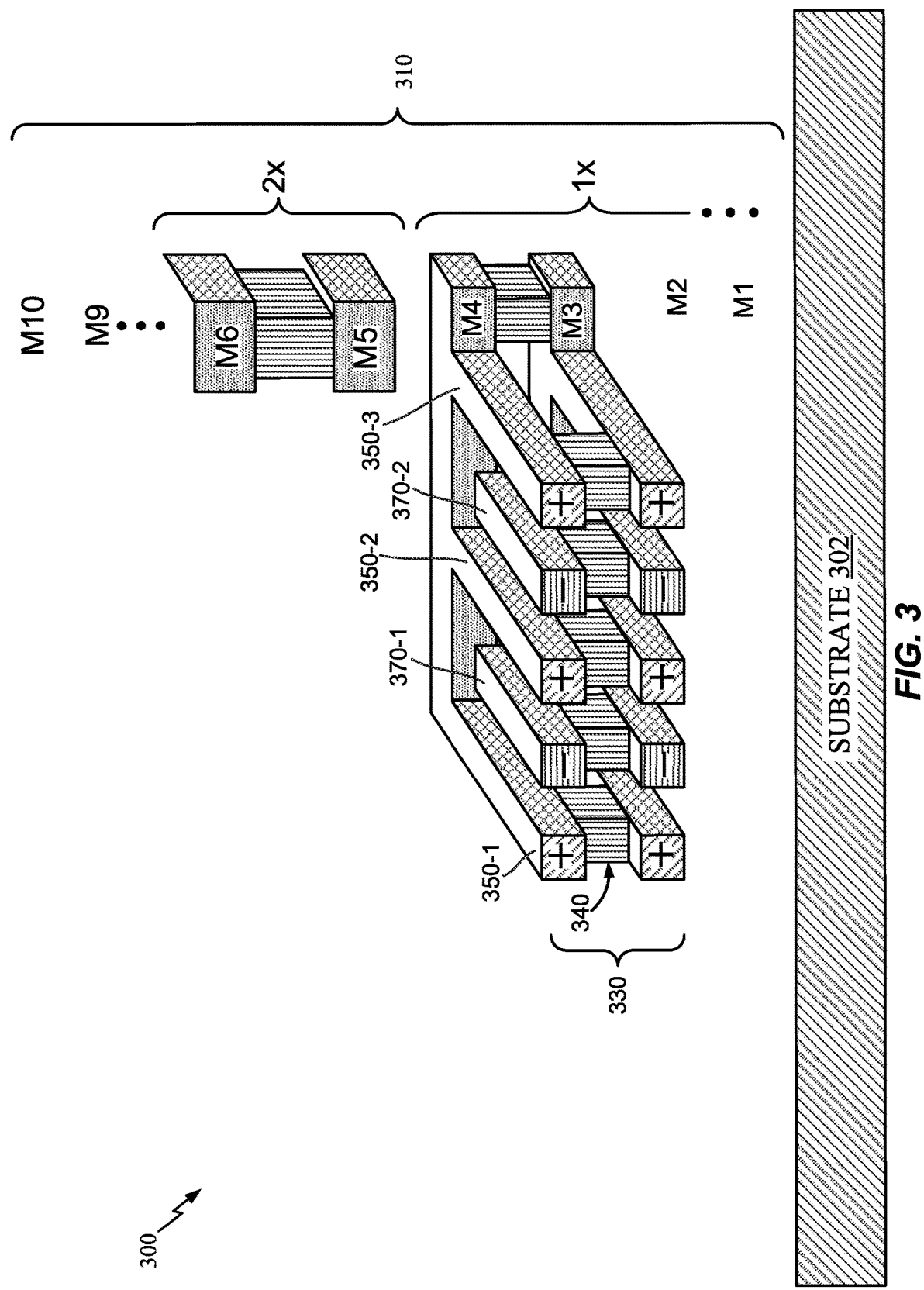
FIG. 3 is a cross-section illustrating an integrated circuit (IC) device including an interconnect stack that contains conventional metal-oxide-metal (MOM) capacitor structures.

Capacitors are widely used in analog integrated circuits. FIG. 3 is a block diagram illustrating a cross-section of an analog integrated circuit (IC) device 300 including an interconnect stack 310. The interconnect stack 310 of the IC device 300 includes multiple conductive interconnect layers (M1, . . . , M9, M10) on a semiconductor substrate (e.g., a diced silicon wafer) 302. The semiconductor substrate 302 supports a metal-oxide-metal (MOM) capacitor 330. In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is provided between the conductive fingers.

In this example, the MOM capacitor 330 is formed within the lower conductive interconnect layers (e.g., M1-M4) of the interconnect stack 310. The lower conductive interconnect layers of the interconnect stack 310 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 3, the MOM capacitor 330 makes use of a inter layer capacitive coupling 340 between fingers (e.g., 350, 370) formed by standard metallization of the conductive interconnects (e.g., wiring lines and vias). The inter layer coupling 340 within the MOM capacitor 330 provides improved matching characteristics.

Figure 4A:
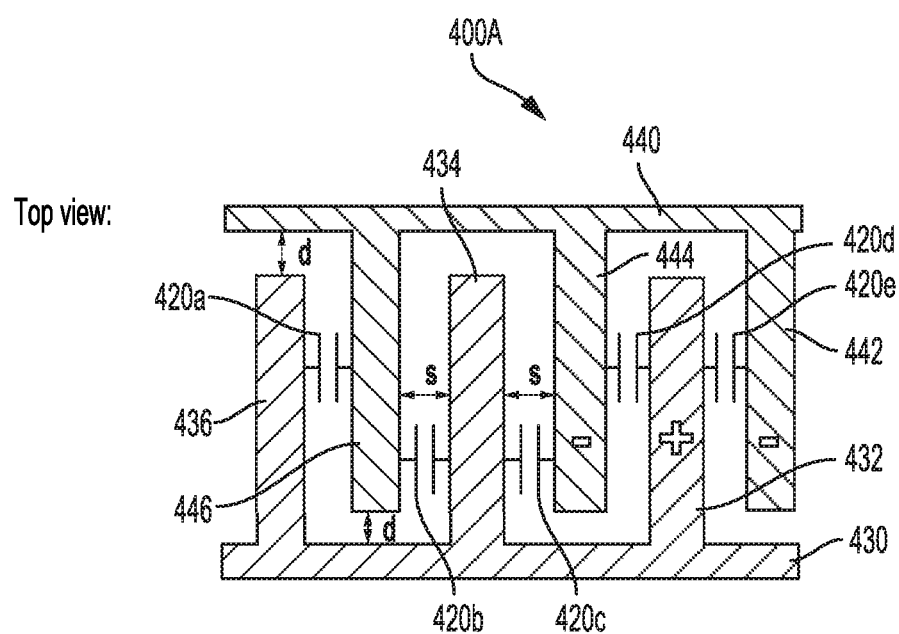
FIG. 4A illustrates a top view of a metal-oxide-metal (MOM) capacitor according to aspects of the present disclosure.

FIG. 4A illustrates a top view of a metal-oxide-metal capacitor (MOMCAP) 400A, according to aspects of the present disclosure. The MOMCAP 400A may be fabricated in one or more BEOL interconnect levels/layers (e.g., M1-M4) such as the multiple conductive interconnect layers (e.g., M1, . . . , M9, M10).

The top view of the MOMCAP 400A includes a first capacitor routing terminal (e.g., endcap or manifold) 430 and a second endcap 440. The first endcap 430 is parallel to the second endcap 440. The first endcap 430 is of a first polarity (e.g., positive or anode) while the second endcap 440 is of a second polarity (e.g., negative or cathode). A first set of parallel conductive capacitor routing traces (e.g., conductive fingers) of the MOMCAP 400A includes a first conductive finger 432, a second conductive finger 434, and a third conductive finger 436.

Each of the first conductive finger 432, the second conductive finger 434, and the third conductive finger 436 is orthogonally coupled to the first endcap 430. Each of the first conductive finger 432, the second conductive finger 434, and the third conductive finger 436 is of the first polarity.

A second set of parallel conductive fingers of the MOMCAP 400A includes a fourth conductive finger 442, a fifth conductive finger 444, and a sixth conductive finger 446. Each of the fourth conductive finger 442, the fifth conductive finger 444, and the sixth conductive finger 446 is orthogonally coupled to the second endcap 440. Each of the fourth conductive finger 442, the fifth conductive finger 444, and the sixth conductive finger 446 is of the second polarity.

The first set of parallel conductive fingers is interdigitated with the second set of parallel conductive fingers at a first interconnect layer to form an array of capacitances 420 (including a first capacitance 420a, a second capacitance 420b, a third capacitance 420c, a fourth capacitance 420d, and a fifth capacitance 420e) between the conductive fingers of the first polarity and the conductive fingers of the second polarity. For example, the second capacitance 420b of the array of capacitances 420 is formed between the second conductive finger 434, which is a conductive finger of the first polarity and the sixth conductive finger 446, which is a conductive finger of the second polarity. The third capacitance 420c of the array of capacitances 420 is formed between the second conductive finger 434 and the fifth conductive finger 444.

The first endcap 430 is parallel to the second endcap 440 such that a first gap d separates the first set of parallel conductive fingers from the second endcap 440 and a second gap d separates the second set of parallel conductive fingers from the first endcap 430. The first set of parallel conductive fingers is interdigitated with the second set of parallel conductive fingers at a first interconnect layer such that a third gap S separates each of the first set of parallel conductive fingers from one or more adjacent second set of parallel conductive fingers. By varying conductive finger spaces (e.g., >40 nanometer) a MOMCAP (e.g., MOMCAP 400A) may support voltages up to 3.3 volts.

Figure 4B:
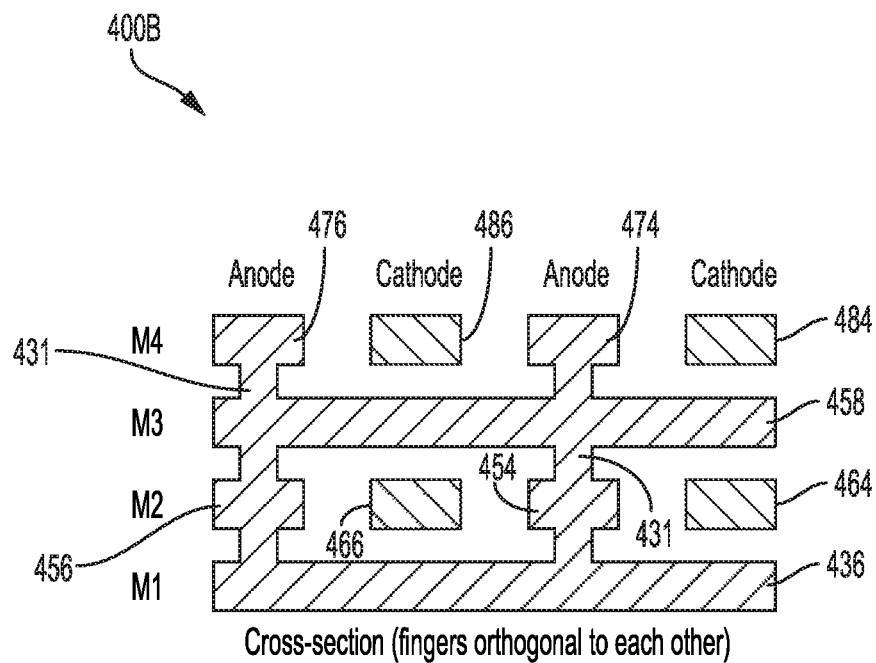
FIG. 4B illustrates a cross-section of conductive fingers of a metal-oxide-metal (MOM) capacitor that are arranged in accordance with an orthogonal configuration.

FIG. 4B illustrates a cross-section 400B of conductive fingers of a metal-oxide-metal (MOM) capacitor in an orthogonal configuration. For example, the cross-section 400B may be of the MOMCAP 400A. For illustrative purposes, some of the labelling and numbering of the devices and features of FIG. 4B are similar to those of FIG. 4A.

The cross-section 400B illustrates multiple conductive interconnect layers (e.g., a first conductive interconnect layer M1, a second conductive interconnect layer M2, a third conductive interconnect layer M3, and a fourth conductive interconnect layer M4). Each of the conductive interconnect layers includes conductive fingers. For example, the first conductive interconnect layer M1 includes a conductive finger 436. The second conductive interconnect layer M2 includes conductive fingers 454, 456, 464, and 466. The third conductive interconnect layer M3 includes a conductive finger 458. The fourth conductive interconnect layer M4 includes conductive fingers 474, 476, 484, and 486. The conductive fingers of the first conductive interconnect layer M1 (e.g., conductive finger 436) and the third conductive interconnect layer M3 (e.g., conductive finger 458) are orthogonal to the conductive fingers of the second conductive interconnect layer M2 (e.g., conductive fingers 454, 456, 464, and 466) and the conductive fingers of the fourth conductive interconnect layer M4 (e.g., conductive fingers 474, 476, 484, and 486). Conductive fingers of a same polarity in different conductive layers are coupled together by vias 431.

Figure 4C:
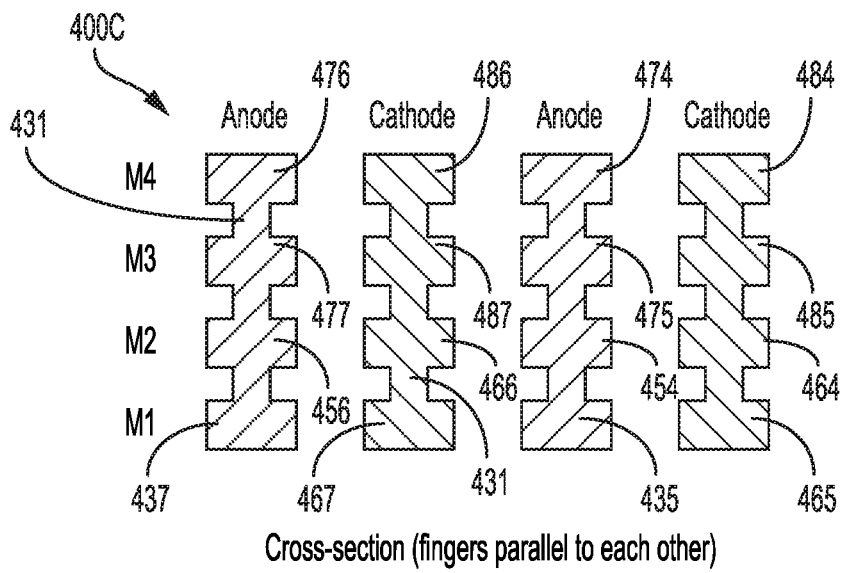
FIG. 4C illustrates a cross-section of conductive fingers of a metal-oxide-metal (MOM) capacitor that are arranged in accordance with a parallel configuration.

FIG. 4C illustrates a cross-section 400C of conductive fingers of a metal-oxide-metal (MOM) capacitor in a parallel configuration. For example, the cross-section 400C may be of the MOMCAP 400A. For illustrative purposes, some of the labelling and numbering of the devices and features of FIG. 4C are similar to those of FIGS. 4A and 4B.

The cross-section 400C illustrates multiple conductive interconnect layers (e.g., the first conductive interconnect layer M1, the second conductive interconnect layer M2, the third conductive interconnect layer M3, and the fourth conductive interconnect layer M4). Each of the conductive interconnect layers includes conductive fingers. For example, the first conductive interconnect layer M1 includes conductive finger 435, 437, 465, and 467. The second conductive interconnect layer M2 includes conductive fingers 454, 456, 464, and 466. The third conductive interconnect layer M3 includes conductive fingers 475, 477, 485, and 487. The fourth conductive interconnect layer M4 includes conductive fingers 474, 476, 484, and 486. In one aspect, the conductive fingers 435, 437, 454, 456, 475, 477, 474, and 476 are of the first polarity while the conductive fingers 465, 467, 464, 466, 485, 487, 484, and 486 are of the second polarity. In each conductive layer, the conductive fingers of the first polarity are arranged in an alternative configuration with respect to the conductive fingers of the second polarity.

The conductive fingers in each of the conductive layers are arranged in accordance with a parallel configuration relative to the conductive fingers in different conductive layers. For example, the conductive fingers of the first conductive interconnect layer M1 (e.g., conductive finger 435, 437, 465, and 467) and the third conductive interconnect layer M3 (e.g., conductive fingers 475, 477, 485, and 487) are parallel to the conductive fingers of the second conductive interconnect layer M2 (e.g., conductive fingers 454, 456, 464, and 466) and the conductive fingers of the fourth conductive interconnect layer M4 (e.g., conductive fingers 474, 476, 484, and 486). Conductive fingers of a same polarity in different conductive layers are coupled together by vias 431.

Figure 5:
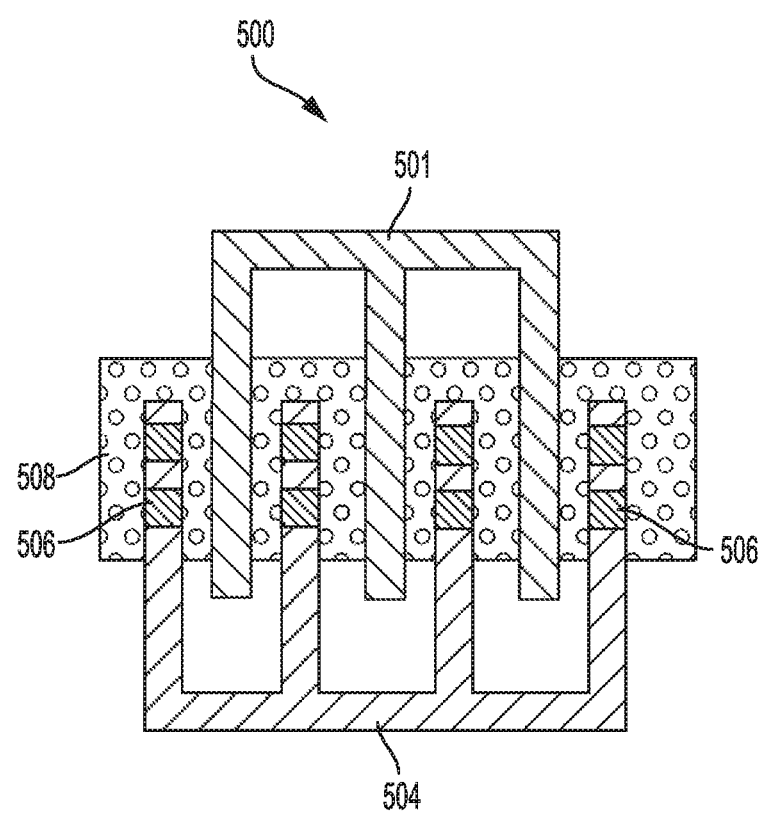
FIG. 5 is a schematic diagram illustrating a single metal-oxide-semiconductor (MOS) capacitor, according to aspects of the present disclosure.

FIG. 5 is a schematic diagram (e.g., top-down view) illustrating a semiconductor device 500 that includes a single metal-oxide-semiconductor capacitor (MOSCAP) and a transistor (e.g., a field effect transistor), according to aspects of the present disclosure. MOS capacitors may also be referred to as metal-oxide-semiconductor varactors (MOSVARs) of either N- or P-type, having capacitance, which varies with applied voltage across their terminals. The MOSCAP and the transistor may be mounted on a semiconductor (e.g., silicon) substrate (not shown). The semiconductor substrate may be a P-type or N-type semiconductor substrate. The semiconductor device 500 includes conductive layers such as electrodes for the MOSCAP, the transistor, and/or shared between the MOSCAP and the transistor. The transistor may have a gate as well as source/drain electrodes. For example, the transistor includes a gate electrode 501 as well as source/drain electrodes 504. The gate electrode 501 may be the anode and the source/drain electrodes 504 may be the cathode of the transistor. The cathode may be accessible for connection using vias 506 in the substrate.

The field effect transistor and the MOSCAP have a shared oxide layer (not shown), such as silicon oxide layer. The oxide layer of the field effect transistor acts as a gate insulating layer while the oxide layer of the MOSCAP acts as a capacitance insulating layer or dielectric. A diffusion region 508 is defined adjacent (e.g., under) the oxide layer. For example, the oxide layer is between the gate electrode 501 and the diffusion region 508. The diffusion region 508 may be doped to form a desired electrode. For example, the diffusion region 508 may be doped to form an N-type electrode or a P-type electrode. The gate electrode 501 may also act as a first (e.g., top) electrode/plate for the MOSCAP while the diffusion region 508 is a second (e.g., bottom) electrode/plate of the MOSCAP. A capacitance of the MOSCAP may also include gate-to-source capacitance. For example, the gate electrode 501 may form a first plate of the MOSCAP and the source/drain electrodes 504 may form a second plate of the MOSCAP. The single MOSCAP may be an N-type MOSCAP or a P-type MOSCAP or a combination of an N-type MOSCAP and a P-type MOSCAP, as illustrated in FIG. 6.

Figure 6:
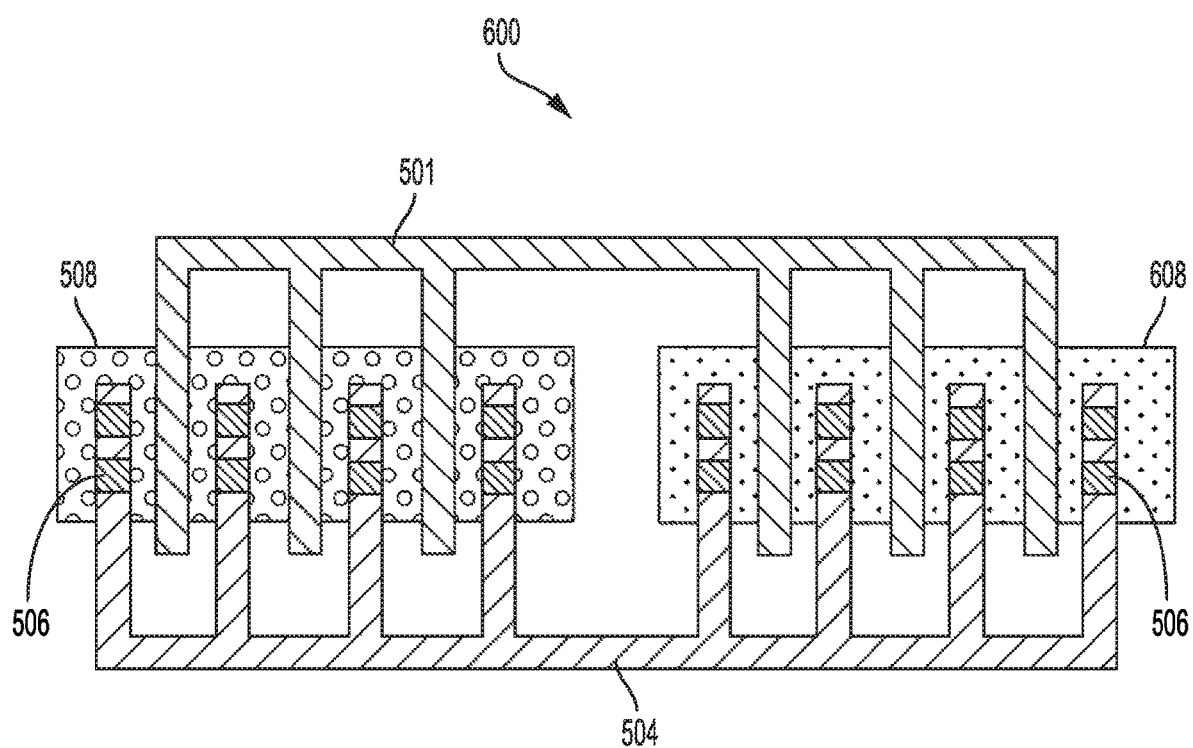
FIG. 6 is a schematic diagram illustrating a dual metal-oxide-semiconductor (MOS) capacitor, according to aspects of the present disclosure.

FIG. 6 is a schematic diagram (e.g., top-down view) illustrating a semiconductor device 600 that includes a dual metal-oxide-semiconductor capacitor (MOSCAP) and a transistor (e.g., a field effect transistor), according to aspects of the present disclosure. For illustrative purposes, some of the labelling and numbering of the devices and features of FIG. 6 are similar to those of FIG. 5. Several of these MOSCAPs may form a MOS varactor (MOSVAR). The dual MOSCAP includes a combination of an N-type MOSCAP and a P-type MOSCAP. The diffusion region 508 may be doped to form an N-type electrode and a second diffusion region 608 may be doped to form a P-type electrode.

For example, a first MOSCAP associated with the diffusion region 508 that is doped to form an N-type electrode forms the N-type MOSCAP in conjunction with the gate electrode 501, conductive layer, and the oxide layer. A second MOSCAP associated with the diffusion region 608 that is doped to form the P-type electrode forms the P-type MOSCAP in conjunction with the gate electrode 501, conductive layer, and the oxide layer.

The MOSCAP may be used for low voltage (e.g., ~0.75V) and high voltage (e.g., ~1.8V) applications. The MOSCAP and the MOSVAR capacitance are voltage dependent. This follows because a MOSCAP is a combination of oxide and voltage dependent semiconductor capacitances. Unfortunately, MOS capacitors may exhibit non-linearity caused by capacitance variation with respect to voltage. MOSCAPs are generally more area efficient than MOMCAPs and therefore can be used in place of or in conjunction with MOMCAPs in a stackcap architecture to save circuit area.

Figure 7A:
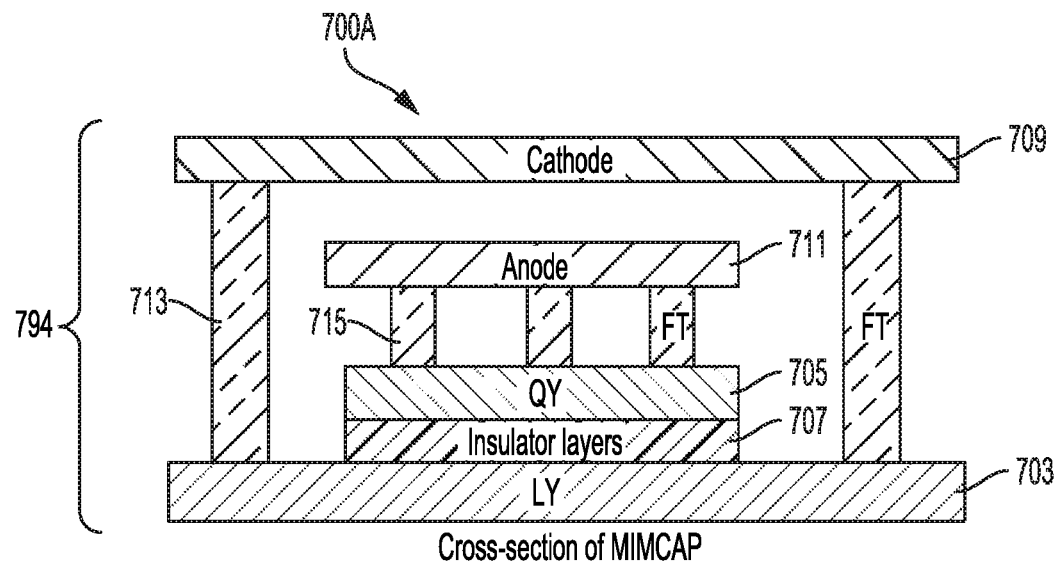
FIG. 7A and FIG. 7B are respectively a cross-section of a metal-insulator-metal capacitor (MIMCAP) and a top-down view of the MIMCAP.
Figure 7B:
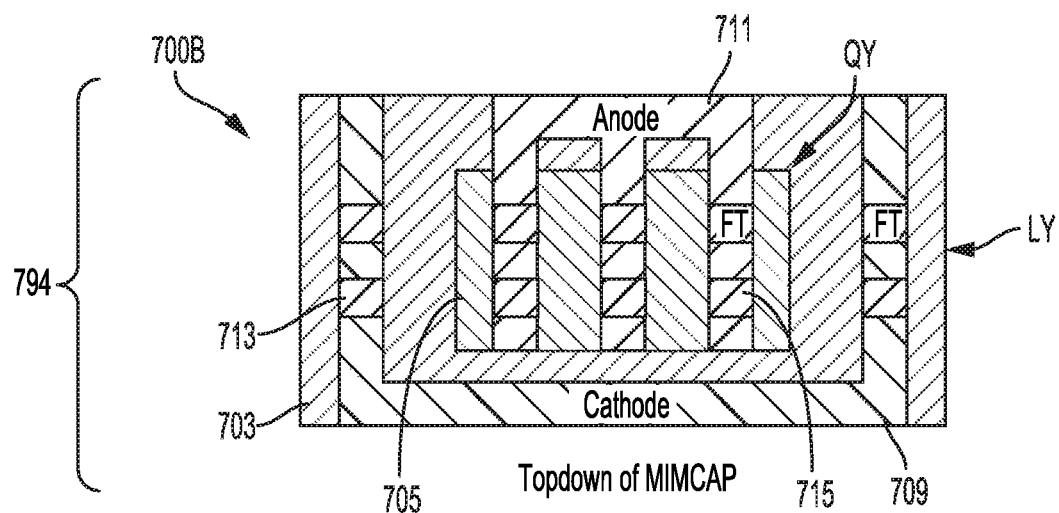

FIG. 7A and FIG. 7B are respectively a cross-section 700A of a metal-insulator-metal capacitor (MIMCAP) 794 and a top-down view 700B of the MIMCAP 794. The MIMCAP 794 may be supported by a substrate (e.g., a semiconductor substrate). The MIMCAP 794 may include a first conductive trace 703 in one conductive layer, a second conductive trace 705 in a different conductive layer, and a dielectric 707 (e.g., insulator material) between the first conductive trace 703 and the second conductive trace 705. The first conductive trace 703 and the second conductive trace 705 constitute top and bottom plates of the MIMCAP 794.

In one aspect of the disclosure, the terminals for the MIMCAP 794 are formed in different conductive layers than the first conductive trace 703 and the second conductive trace 705. For example, a second polarity terminal (e.g., cathode) 709 may be formed on a conductive layer and coupled to the first conductive trace 703 in a different conductive layer by vias 713. A first polarity terminal (e.g., anode) 711 may be formed on a conductive layer and coupled to the second conductive trace 705 in a different conductive layer by vias 715. By tuning a thickness (e.g., 10-20 nanometers) or property (e.g., high K material HfO2, HfZrO2) of the insulator material of the dielectric 707, the MIMCAP 794 can be configured to support up to 1.8 volts with leakage of less than 100 nanoamperes per centimeter squared. The high K material may be Hafnium(IV) oxide (HfO2) or hafnium zirconium oxide (HfZrO2).

Figure 8:
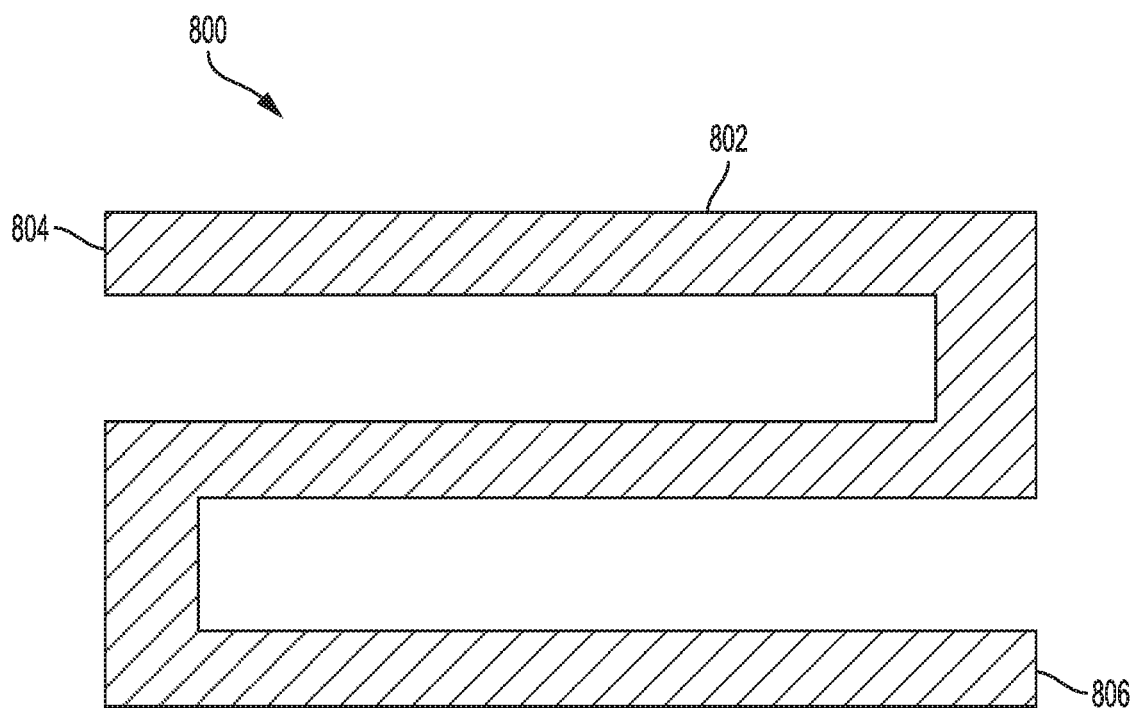
FIG. 8 illustrates a schematic diagram of a resistor.

FIG. 8 illustrates a schematic diagram of a resistor 800. The resistor 800 includes a conductive (e.g., metal) resistor element 802, a first terminal 804 and a second terminal 806. For example, a signal may flow into the first terminal 804 and exit at the second terminal 806 or vice versa.

The resistor 800 may be used as part of a resistor-capacitor (RC) delay cell. Conventional RC delay cells have a one-to-one resistor-capacitor relationship. For example, a single resistor (e.g., the resistor 800) and a single capacitor (e.g., MOMCAP 400A) are used to form each delay cell. This configuration does not provide enough RC delay and occupies a relatively large footprint. To increase RC delay, some implementations combine multiple of these delay cells where each delay cell has the one-to-one resistor-capacitor relationship. These implementations, however, further increase the footprint of the RC delay cell.

Figure 9:
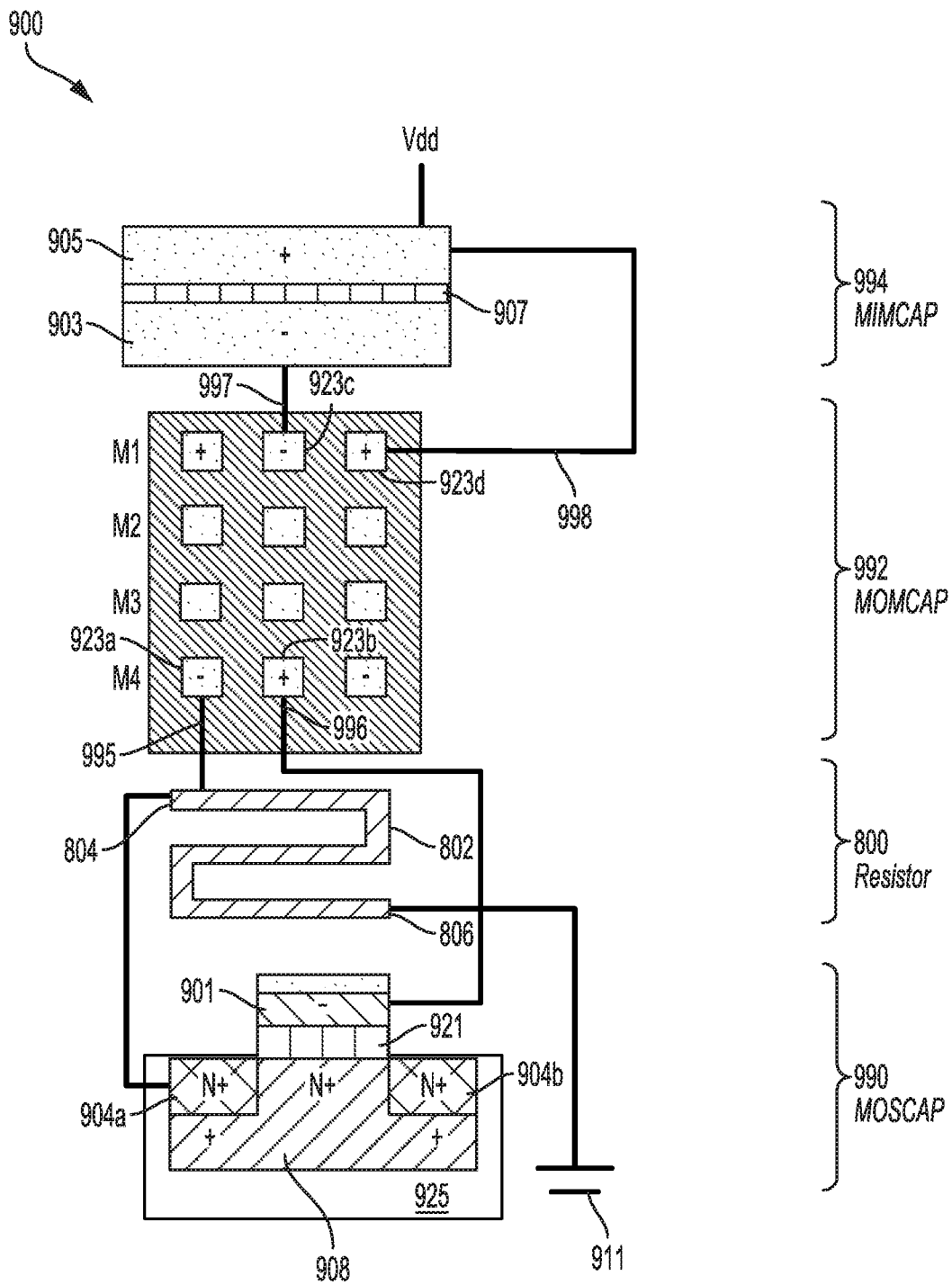
FIG. 9 illustrates a stacked resistor-capacitor (RC) delay cell including multiple capacitors and a single resistor, according to aspects of the present disclosure.

FIG. 9 illustrates a stacked RC delay cell 900 including multiple capacitors and a single resistor, according to aspects of the present disclosure. For illustrative purposes, some of the labelling and numbering of the devices and features of FIG. 9 are similar to those of FIG. 8. Each of the multiple capacitors may be a same type of capacitor (e.g., a metal-oxide-metal capacitor (MOMCAP) or a metal-insulator-metal capacitor (MIMCAP)) or a different type of capacitors. For example, the capacitors can be a metal-oxide-semiconductor capacitor (MOSCAP) 990, a MOMCAP 992, and a MIMCAP 994. The MOSCAP 990, the MOMCAP 992, and the MIMCAP 994 may be coupled to a single resistor (e.g., the resistor 800) to form the stacked RC delay cell 900. The multiple capacitors and the resistor may be formed on different layers.

The stacked RC delay cell 900 includes the MOSCAP 990, the MOMCAP 992, and the MIMCAP 994 and the resistor stacked together on a substrate 925. The MOSCAP 990 includes a gate 901 (e.g., the gate electrode 501 of FIG. 5), source/drain (S/D) regions 904a and 904b (e.g., source/drain electrodes 504 of FIG. 5), and a diffusion region 908 (e.g., the diffusion region 508 of FIG. 5 or 608 of FIG. 6). The MOSCAP 990 also includes a dielectric 921 (e.g., the oxide layer discussed with reference to FIG. 5). The resistor 800 may be positioned between the MOSCAP 990 and the MOMCAP 992 in different layers but substantially within a same footprint as the MOSCAP 990 and the MOMCAP 992. Of course, the resistor 800 may be positioned in other layers of the RC structure. For example, the resistor 800 may be between the MOMCAP 992 and the MIMCAP 994. The resistor 800 may also be a polysilicon resistor fabricated on the substrate 925.

The resistor 800 is included in the back-end-of-line (BEOL) layers over the MOSCAP 990 or is supported by the MOSCAP 990. The MOMCAP 992 (e.g., the MOMCAP 400A) is included in other layers of the BEOL layers that are different from the layers in which the resistor 800 is included. The MOMCAP 992 includes interdigitated fingers. For example, the MOMCAP 992 is included in the back-end-of-line (BEOL) layers over the resistor 800 or is supported by the resistor 800. The MIMCAP 994 is included in other layers of the BEOL layers that are different from the layers in which the MOMCAP 992 and the resistor 800 are included. The MIMCAP 994 includes a dielectric between a set of plates. For example, the MIMCAP 994 is included in the back-end-of-line (BEOL) layers over the MOMCAP 992 or is supported by the MOMCAP 992. Of course, being "over" or being "supported" is based on an orientation of the capacitors and resistors. However, for purpose of explanation, the description is based on the orientation of the capacitors and resistors, as shown in the figures.

Electrodes or terminals (e.g., anodes and cathodes) of the multiple capacitors and the terminals of the resistor 800 are coupled to each other as part of the fabrication process so an end user does not have to manually connect the anodes and the cathodes of the capacitors and the first terminal 804 and the second terminal 806 of the resistor 800. For example, the MOSCAP 990 includes a first cathode (e.g., the source/drain region 904a/904b) and a first anode (e.g., the gate 901).

The MOMCAP 992 is dispersed across multiple conductive layers including conductive layers M1, M2, M3, and M4. The conductive layer M4 includes a first portion 923a and a second portion 923b. The conductive layer M1 includes a third portion 923c and a fourth portion 923d. The different portions of the MOMCAP in the conductive layers M1, M2, M3, and M4 may be coupled together by vias. For example, conductive fingers of the MOMCAP 992 that have positive polarity (e.g., the second portion 923b and the fourth portion 923d) are coupled to the positive electrode (e.g., anode or first endcap 430 of FIG. 4A) and conductive fingers of the negative polarity (e.g., the first portion 923a and the third portion 923c) are coupled to the negative electrode (e.g., cathode or second endcap 440 of FIG. 4A) of the MOMCAP 400A.

For simplicity, interconnects 996 and 998 are connected to the anodes (e.g., first endcap 430 as shown in FIG. 4A) of the second portion 923b and the fourth portion 923d of the MOMCAP 992, and interconnects 995 and 997 are connected to the cathodes (e.g., second endcap 440 as shown in FIG. 4A) of the first portion 923a and the third portion 923c of the MOMCAP 992. However, other interconnects (not shown) may be connected to cathodes of the second portion 923b and the fourth portion 923d of the MOMCAP 992 so that all cathodes of the capacitors are connected together. Similarly, other interconnects (not shown) may be connected to anodes of the first portion 923a and the third portion 923c of the MOMCAP 992 so that all anodes of the capacitors are connected together.

The anode or gate 901 of the MOSCAP 990 is connected to the interconnect 996, which is connected to the anode (e.g., first endcap 430 as shown in FIG. 4A) corresponding to the second portion 923b of the MOMCAP 992. The cathode or source/drain (S/D) region 904a of the MOSCAP 990 is connected to the interconnect 995, which is connected to the cathode corresponding to the first portion 923a of the MOMCAP 992 via the first terminal 804 of the resistor 800. The second terminal 806 of the resistor 800 is connected to ground 911.

The MIMCAP 994 may include a first conductive trace 903 (e.g., the first conductive trace 703 shown in FIG. 7A) in one conductive layer and a second conductive trace 905 (e.g., the second conductive trace 705 shown in FIG. 7A) in a different conductive layer, and a dielectric 907 (e.g., the dielectric 707 shown in FIG. 7A) between the first conductive trace 903 and the second conductive trace 905. The first conductive trace 903, which is a first terminal of the MIMCAP 994 (e.g., a cathode of the MIMCAP 994) is connected to the third portion 923c of the MOMCAP 992 via the interconnect 997. The second conductive trace 905, which is a second terminal of the MIMCAP 994 (e.g., an anode of the MIMCAP 994) is connected to the fourth portion 923d of the MOMCAP 992 via the interconnect 998. The second conductive trace 905 is also connected to a voltage source to receive an input voltage (e.g., Vdd) of the stacked RC delay cell 900.

Figure 10:
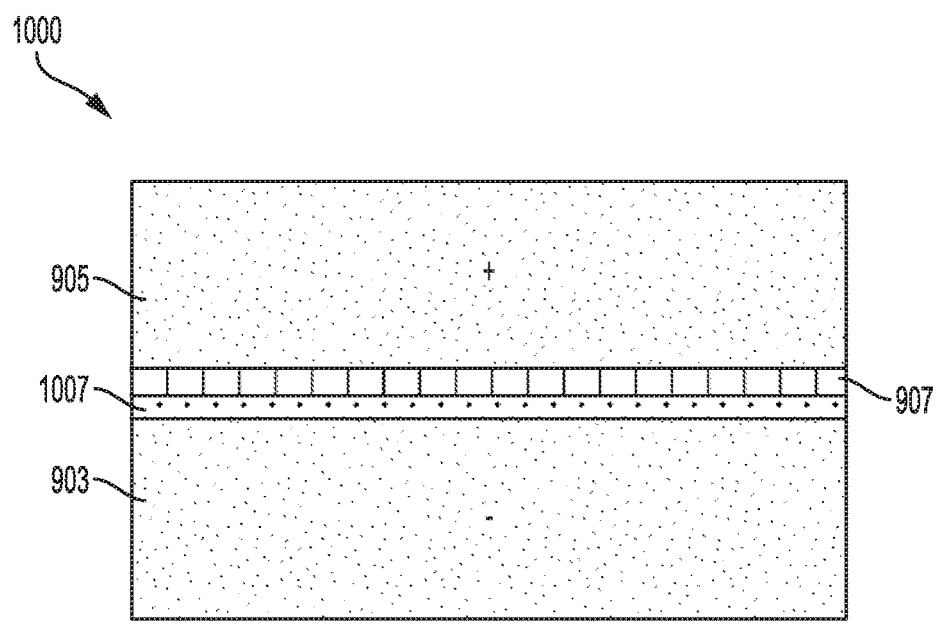
FIG. 10 illustrates a cross-section of a metal-insulator-metal capacitor (MIMCAP), according to aspects of the present disclosure.

FIG. 10 illustrates a cross-section of a metal-insulator-metal capacitor (MIMCAP) 1000, according to aspects of the present disclosure. For illustrative purposes, some of the labelling and numbering of the devices and features of FIG. 10 are similar to those of FIG. 9. The difference between the MIMCAP 1000 and the MIMCAP 994 is that the MIMCAP 1000 includes a negative capacitor material 1007 as a dielectric between the first conductive trace 903 and the second conductive trace 905. In one aspect of the present disclosure, the MIMCAP 994 may be replaced by the MIMCAP 1000 in the stacked RC delay cell 900. The negative capacitor material 1007 increases capacitance density (or increases the capacitance) of the MIMCAP 1000

Figure 11:
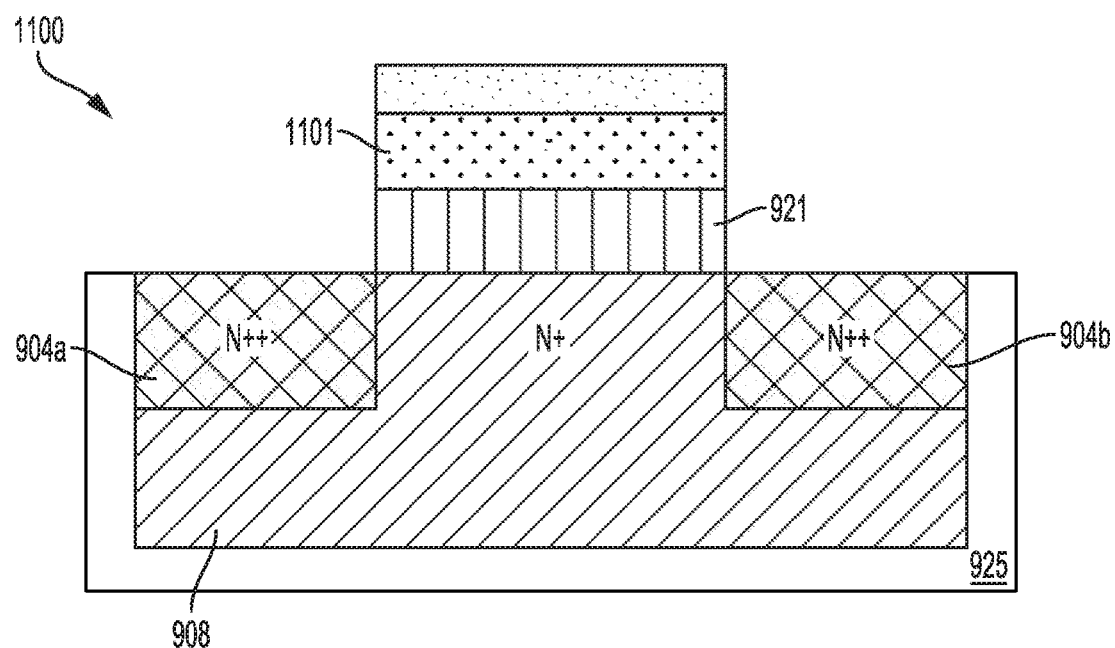
FIG. 11 is a schematic diagram illustrating a metal-oxide-semiconductor (MOS) capacitor, according to aspects of the present disclosure.

FIG. 11 is a schematic diagram illustrating a metal-oxide-semiconductor capacitor (MOSCAP) 1100, according to aspects of the present disclosure. For illustrative purposes, some of the labelling and numbering of the devices and features of FIG. 11 are similar to those of FIG. 9. The difference between the MOSCAP 1100 and the MOSCAP 990 is that the MOSCAP 1100 includes a negative capacitor material 1101 (e.g., a ferromagnetic material). The negative capacitor material 1101 is in a stack with the gate dielectric. In one aspect of the present disclosure, the MOSCAP 990 may be replaced by the MOSCAP 1100 in the stacked RC delay cell 900. The negative capacitor material 1101 increases capacitance density (or increases the capacitance) of the MOSCAP 1100.

Figure 12:
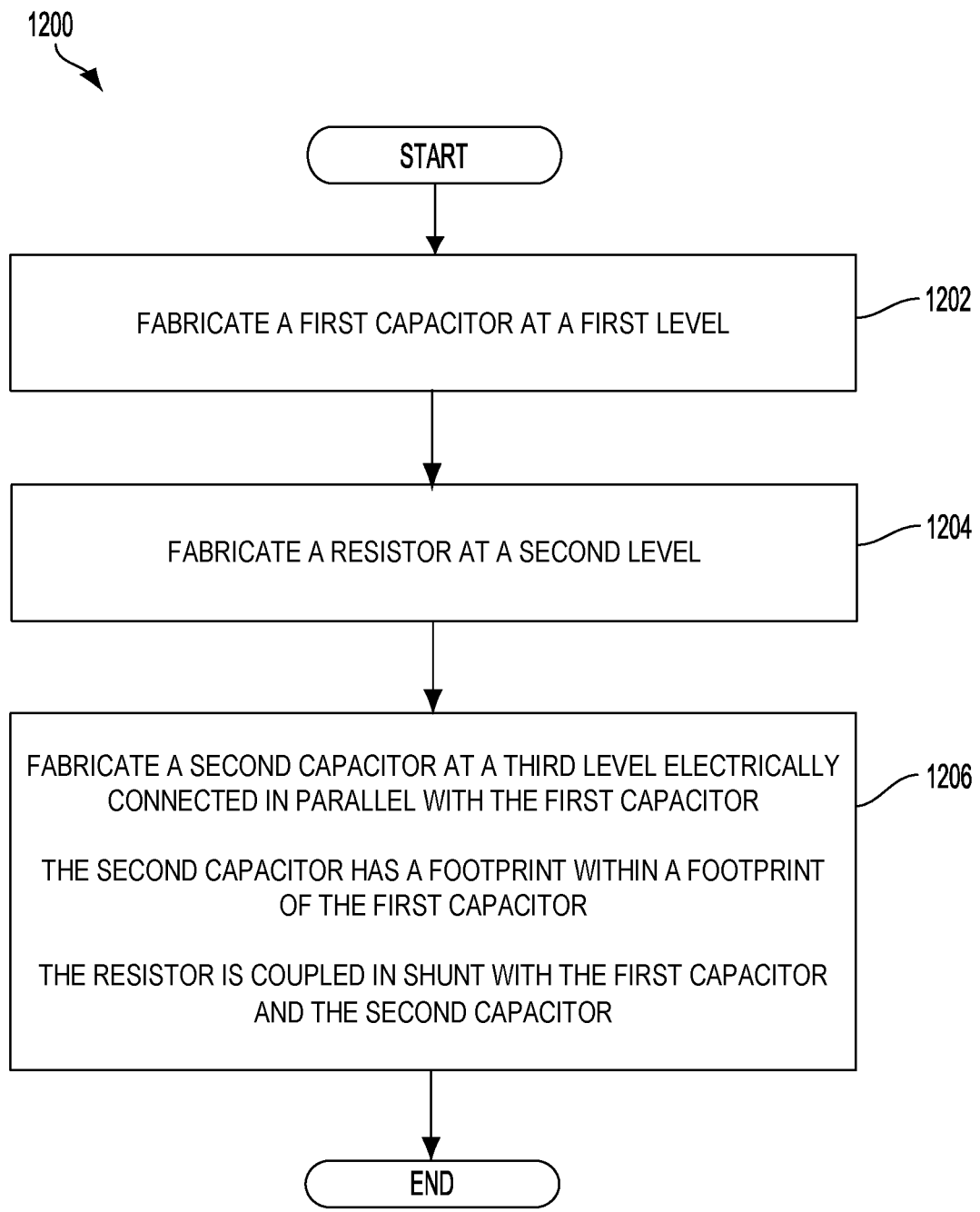
FIG. 12 illustrates a method of fabricating an integrated circuit, according to aspects of the present disclosure.

FIG. 12 illustrates a method 1200 of fabricating an integrated circuit device (e.g., a stacked RC delay cell), according to aspects of the present disclosure. The method 1200 begins at block 1202, where a first capacitor is fabricated at a first level. At block 1204, a resistor is fabricated at a second level. At block 1206, a second capacitor is fabricated at a third level. The second capacitor is electrically connected in parallel with the first capacitor. The second capacitor has a footprint within a footprint of the first capacitor. The resistor is coupled in shunt with the first capacitor and the second capacitor.

According to an aspect of the present disclosure, an integrated circuit device is described. In one configuration, the integrated circuit device includes means for storing electrical charge at a third level electrically connected in parallel with the first capacitor. For example, the electrical charge storing means may be the MOMCAP 992, as shown in FIG. 9, the MIMCAP 994, as shown in FIG. 9 and/or the MIMCAP 1000, as shown in FIG. 10. In another aspect, the aforementioned means may be any module or any apparatus or material configured to perform the functions recited by the aforementioned means.

Figure 13:
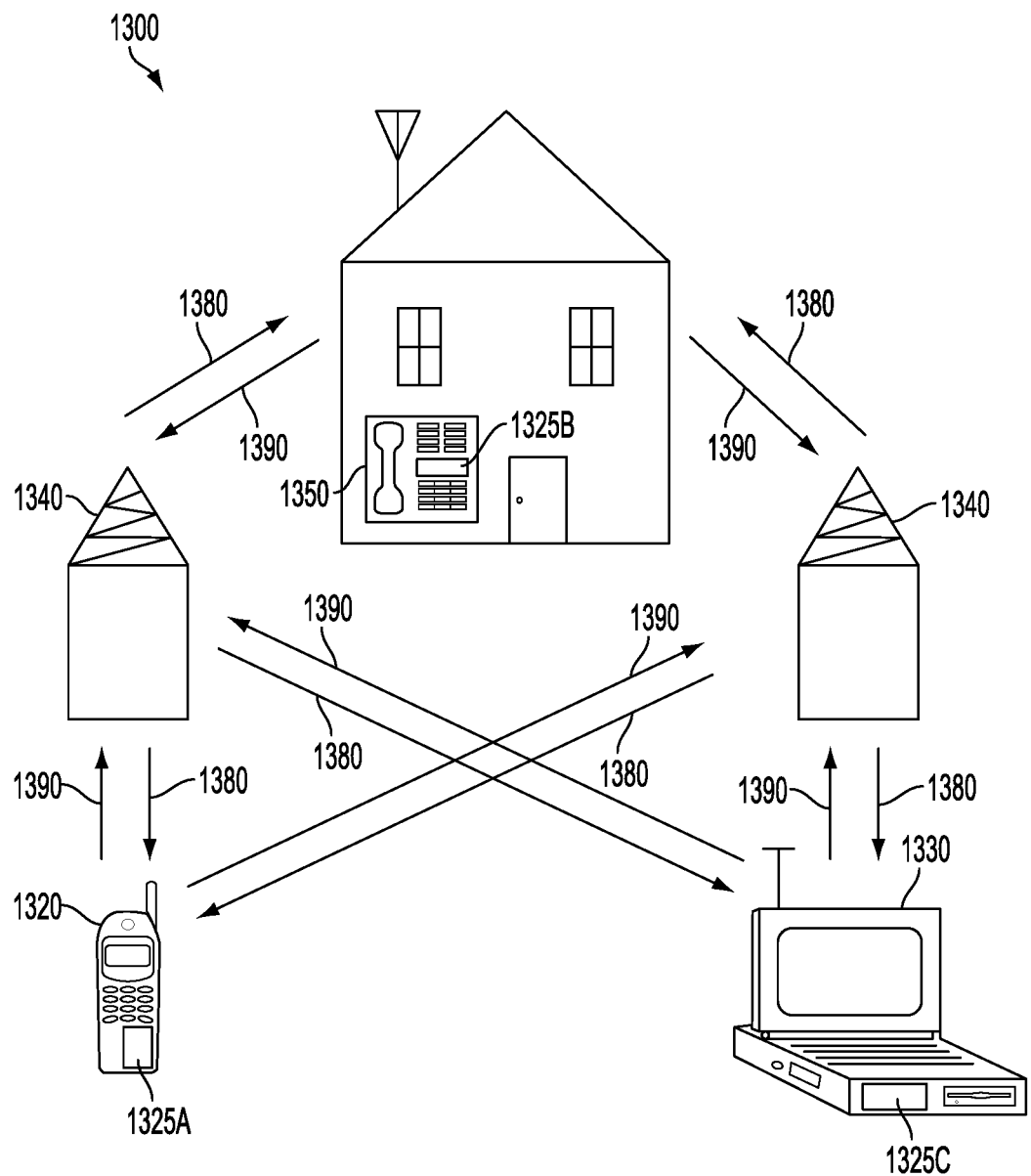
FIG. 13 is a block diagram showing an exemplary wireless communications system in which an aspect of the present disclosure may be advantageously employed.

FIG. 13 is a block diagram showing an exemplary wireless communications system 1300 in which an aspect of the present disclosure may be advantageously employed. For purposes of illustration, FIG. 13 shows three remote units 1320, 1330, and 1350 and two base stations 1340. It will be recognized that wireless communications systems may have many more remote units and base stations. Remote units 1320, 1330, and 1350 include IC devices 1325A, 1325B, and 1325C that include the disclosed integrated circuit device. It will be recognized that other devices may also include the disclosed integrated circuit device, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base station 1340.

In FIG. 13, remote unit 1320 is shown as a mobile telephone, remote unit 1330 is shown as a portable computer, and remote unit 1350 is shown as a fixed location remote unit in a wireless local loop system. For example, the remote units may be a mobile phone, a hand-held personal communications systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 13 illustrates remote units according to the aspects of the present disclosure, the present disclosure is not limited to these exemplary illustrated units. Aspects of the present disclosure may be suitably employed in many devices, which include the disclosed integrated circuit device.

Figure 14:
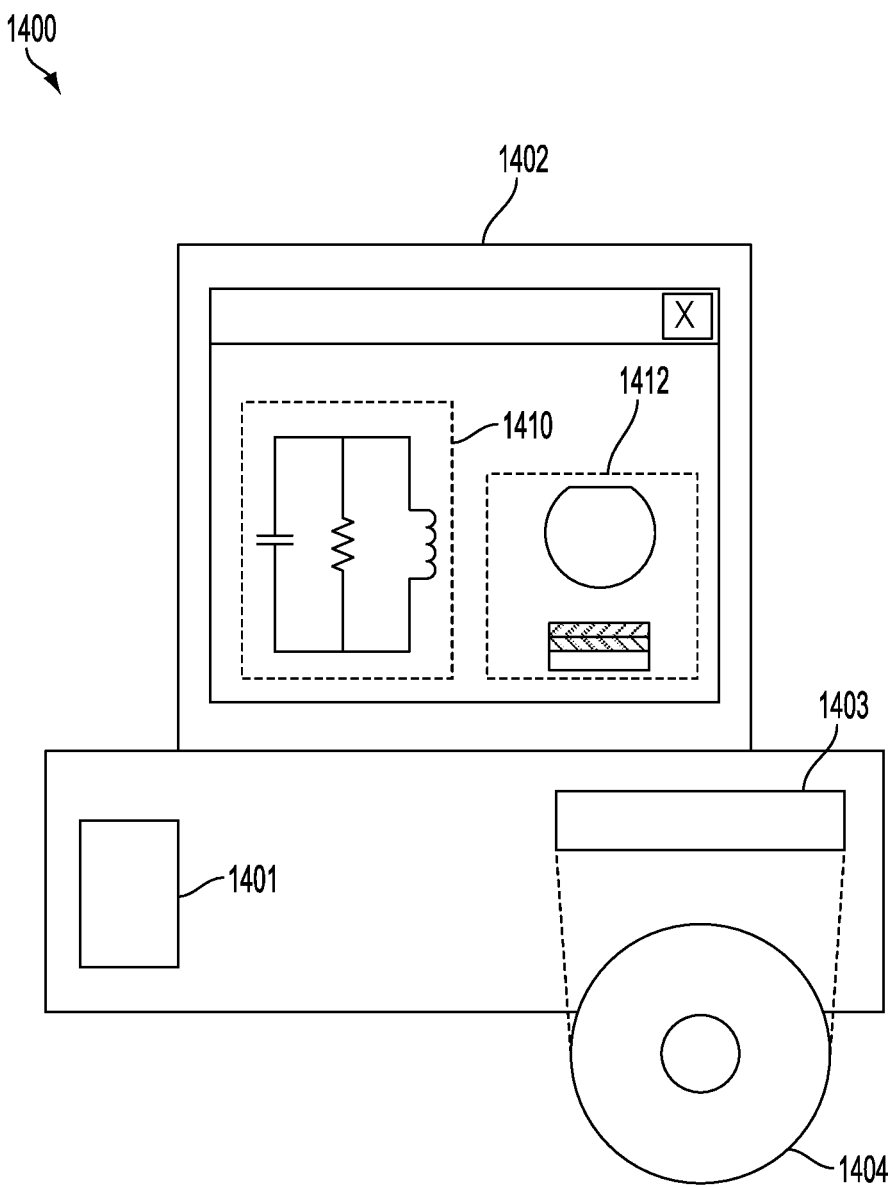
FIG. 14 is a block diagram illustrating a design workstation used for circuit, layout, and logic design of integrated circuits according to one configuration.

FIG. 14 is a block diagram illustrating a design workstation used for circuit, layout, and logic design of an IC structure, such as the integrated circuit device disclosed above. A design workstation 1400 includes a hard disk 1401 containing operating system software, support files, and design software such as Cadence or OrCAD. The design workstation 1400 also includes a display 1402 to facilitate design of a circuit 1410 or an IC device 1412 including the disclosed integrated circuit device. A storage medium 1404 is provided for tangibly storing the design of the circuit 1410 or the IC device 1412. The design of the circuit 1410 or the IC device 1412 may be stored on the storage medium 1404 in a file format such as GDSII or GERBER. The storage medium 1404 may be a CD-ROM, DVD, hard disk, flash memory, or other appropriate device. Furthermore, the design workstation 1400 includes a drive apparatus 1403 for accepting input from or writing output to the storage medium 1404.

Data recorded on the storage medium 1404 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1404 facilitates the design of the circuit 1410 or the IC device 1412 including the disclosed integrated circuit device by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on non-transitory computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. A resistor-capacitor (RC) delay circuit comprising:
   a first capacitor at a first level;
   a resistor at a second level; and
   a second capacitor at a third level electrically connected in parallel with the first capacitor, the second capacitor having a footprint within a footprint of the first capacitor, the resistor coupled in shunt with the first capacitor and the second capacitor, a terminal of the resistor being coupled to ground.

2. The resistor-capacitor delay circuit of claim 1, in which the first capacitor comprises a metal-oxide-semiconductor (MOS) capacitor, a metal-insulator-metal (MIM) capacitor, or a metal-oxide-metal (MOM) capacitor.

3. The resistor-capacitor delay circuit of claim 1, in which the resistor comprises a polysilicon or metal resistor.

4. The resistor-capacitor delay circuit of claim 1, further comprising a third capacitor at a fourth level, the third capacitor electrically connected in parallel with the first capacitor and the second capacitor, the third capacitor having a footprint within the footprint of the first capacitor.

5. The resistor-capacitor delay circuit of claim 1, in which the first capacitor comprises a negative capacitance material.

6. The resistor-capacitor delay circuit of claim 1, in which the second capacitor comprises a negative capacitance material.

7. The resistor-capacitor delay circuit of claim 1, in which the first capacitor comprises a metal-oxide-metal capacitor with via connections.

8. A method of fabricating a resistor-capacitor (RC) delay circuit comprising:
   fabricating a first capacitor at a first level;
   fabricating a resistor at a second level; and
   fabricating a second capacitor at a third level electrically connected in parallel with the first capacitor, the second capacitor having a footprint within a footprint of the first capacitor, the resistor coupled in shunt with the first capacitor and the second capacitor, a terminal of the resistor being coupled to ground.

9. The method of claim 8, in which fabricating the first capacitor comprises fabricating a metal-oxide-semiconductor (MOS) capacitor, a metal-insulator-metal (MIM) capacitor, or a metal-oxide-metal (MOM) capacitor.

10. The method of claim 8, in which fabricating the resistor comprises fabricating a polysilicon or metal resistor.

11. The method of claim 8, further comprising fabricating a third capacitor at a fourth level, the third capacitor electrically connected in parallel with the first capacitor and the second capacitor, the third capacitor having a footprint within the footprint of the first capacitor.

12. The method of claim 8, in which fabricating the first capacitor comprises fabricating the first capacitor with a first negative capacitance material.

13. The method of claim 8, in which fabricating the second capacitor comprises fabricating the second capacitor with a second negative capacitance material.

14. The method of claim 8, in which fabricating the first capacitor comprises fabricating the first capacitor as a metal-oxide-metal capacitor with via connections.

15. A resistor-capacitor (RC) delay circuit comprising:
    a first capacitor at a first level;
    a resistor at a second level; and
    means for storing electrical charge at a third level electrically connected in parallel with the first capacitor, the means for electrical charge storing having a footprint within a footprint of the first capacitor, the resistor coupled in shunt with the first capacitor and the electrical charge storing means, a terminal of the resistor being coupled to ground.

16. The resistor-capacitor delay circuit of claim 15, in which the first capacitor comprises a metal-oxide-semiconductor (MOS) capacitor, a metal-insulator-metal (MIM) capacitor, or a metal-oxide-metal (MOM) capacitor.

17. The resistor-capacitor delay circuit of claim 15, in which the resistor comprises a polysilicon or metal resistor.

18. The resistor-capacitor delay circuit of claim 15, further comprising a third capacitor at a fourth level, the third capacitor electrically connected in parallel with the first capacitor and the means for electrical charge storing, the third capacitor having a footprint within the footprint of the first capacitor.

19. The resistor-capacitor delay circuit of claim 15, in which the first capacitor comprises a negative capacitance material.

20. The resistor-capacitor delay circuit of claim 15, in which the first capacitor comprises a metal-oxide-metal capacitor with via connections.

* * * * *